United States Patent
Dubois et al.

(10) Patent No.: US 10,594,201 B2
(45) Date of Patent: Mar. 17, 2020

(54) GATE DRIVER

(71) Applicant: Hamilton Sundstrand Corporation, Charlotte, NC (US)

(72) Inventors: Fabien Dubois, Glanmire (IE); Vladimir Blasko, Avon, CT (US); Thomas Gietzold, Stratford upon Avon (GB); Virgilio Valdivia Guerrero, Roquetas de Mar (ES); Filip Hormot, Villach (AT)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/165,257

(22) Filed: Oct. 19, 2018

(65) Prior Publication Data

US 2019/0229603 A1    Jul. 25, 2019

(30) Foreign Application Priority Data

Jan. 19, 2018  (EP) ..................... 18152563

(51) Int. Cl.
| H03B 1/00 | (2006.01) |
| H02M 1/08 | (2006.01) |
| H03K 17/08 | (2006.01) |
| H03K 17/691 | (2006.01) |
| H02M 3/07 | (2006.01) |

(52) U.S. Cl.
CPC .............. *H02M 1/08* (2013.01); *H03K 17/08* (2013.01); *H03K 17/691* (2013.01); *H02M 3/07* (2013.01)

(58) Field of Classification Search
CPC .... H04B 2203/5483; H04B 2203/5491; H04B 3/54; H02J 7/025; H02J 50/12
See application file for complete search history.

(56) References Cited

U.S. PATENT DOCUMENTS

| 9,401,646 | B2 | 7/2016 | Sagneri et al. |
| 9,479,074 | B2 | 10/2016 | Nagai |
| 2009/0147544 | A1 | 6/2009 | Melanson |
| 2017/0070354 | A1 | 3/2017 | Ragonese et al. |

FOREIGN PATENT DOCUMENTS

| CN | 103337964 A | 10/2013 | |
| EP | 3076550 A1 | * 10/2016 | ........... H03K 17/063 |
| EP | 3076550 A1 | 10/2016 | |
| WO | 2011112795 A1 | 9/2011 | |

OTHER PUBLICATIONS

Extended European Search Report for International Application No. 18152563.5 dated Jul. 16, 2018, 8 pages.
Stephane Brehaut et al., Gate Driving of High Power IGBT Through a Double Galvanic Insulation Transformer:, IEEE Industrial Electronics, IECON 2006—32nd Annual Conference on, IEEE, Piscataway, NJ, USA, Nov. 1, 2006, pp. 2505-2510, 6 pages.

* cited by examiner

*Primary Examiner* — Sibin Chen
(74) *Attorney, Agent, or Firm* — Cantor Colburn LLP

(57) ABSTRACT

A power converter gate driver arrangement for providing a power output and a switching output for switching, in use, one or more switching devices, wherein the switching devices are controlled from a digital core via isolated point-to-point RF drivers. The gate driver uses UHF band technology to transmit both signal and power through a low capacitance single resonator by signal and power modulation. Power is transmitted in a continuous manner.

5 Claims, 15 Drawing Sheets

GATE DRIVER

FOREIGN PRIORITY

This application claims priority to European Patent Application No. 18152563.5 filed Jan. 19, 2018, the entire contents of which is incorporated herein by reference.

TECHNICAL FIELD

The present disclosure relates to a gate driver for a power converter.

BACKGROUND

Power converters are used to transfer power from a source to a load using a different type or level of electrical power.

These power converters e.g. inverters, active rectifiers, DC-DC converters etc. include high power semiconductor switching devices such as FETs, MOSFETs, IGBTs, etc. A power semiconductor switching device requires sufficient power applied to its input to perform its switching tasks, in time and in steady state. Many of these high power switching devices utilise a gate driver to turn them on and off. A power supply provides the required voltage to the gate driver electronics. The gate driver electronics provide the logic state to the power devices. The power to the input of power device is applied through the output switching stage.

The gate drive electronics provides protection functions etc. as well. The complete gate driver electronics act as the interface between the low voltage electronics and the high voltage power electronics.

It is often necessary to galvanically isolate the low voltage and high voltage sides for functional and safety reasons. There is also a need to minimise current and voltage fed back into the logic elements, which can undesirably affect the drive elements or can produce spurious logic circuit glitches. Often, the two sides are provided with isolated electronics and power supplies to provide electrical isolation between the two subsystems.

A problem with gate drivers designed in this way is that they may be subject to stray parasitic inductance or capacitance which can cause noise coupling from the power circuit to the control logic and can increase electromagnetic interference (EMI) and non-deterministic behaviour of the system.

Digital isolators are available, but these require a dedicated isolated power supply, which increases the overall weight and cost of the system.

Other solutions do exist for isolation, such as optocouplers, but these are not suitable for high reliability, high temperature and high noise systems as required in aerospace applications, and these solutions also require independent electronics and power supplies.

SUMMARY

According to the present disclosure there is provided a power converter gate driver arrangement for providing a power output and a switching output for switching, in use, one or more switching devices, comprising: a digital control unit to provide a switching control signal and one or more isolated RF drive units connected to receive the switching control signal from the digital control unit and to output the power output and the switching output; the or each isolated RF drive unit comprising: oscillator means to generate one or more carrier frequencies a single channel modulator to modulate the switching control signal onto one or more carrier frequencies; means for modulating a drive power signal onto a different one or more carrier frequencies; a single broadband resonator to transmit the modulated switching control signal and the modulated drive power signal a rectifier configured to rectify the modulated drive power signal and to provide the rectified signal to a power supply unit to provide the power output; and means for demodulating and reconstructing the modified switching control signal to provide the switching output.

The arrangement preferably comprises a respective isolated RF drive unit for each switching device to be switched.

In the preferred arrangement, the single broadband resonator is configured to transmit the modulated drive power signal via a continuous wave signal.

BRIEF DESCRIPTION OF THE DRAWINGS

Preferred embodiments will now be described by way of example only, with reference to the drawings.

DETAILED DESCRIPTION

Figure 1A:
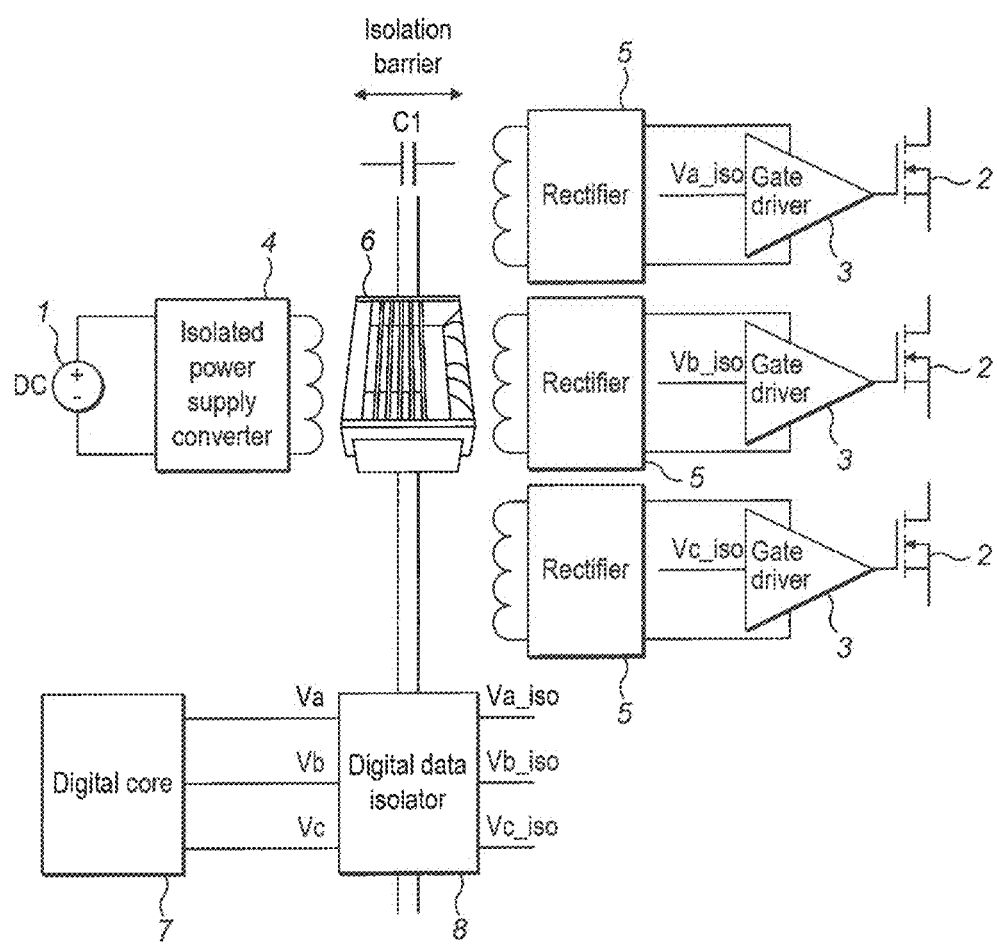
FIG. 1A is a block diagram of a conventional gate driver arrangement for a power converter.

FIG. 1A shows a conventional power converter gate driver arrangement wherein DC power is provided from a power supply 1 via power converter and gate driver circuitry to switching circuitry—here three switching devices 2 (MOSFETs, in this example). The switching devices are turned on and off by a gate driver 3. The gate drivers 3 are powered from the power supply 1 via an isolated power converter 4 on the power electronics side and via rectifiers 5 on the driver side. The two sides are isolated by an insulation barrier here implemented by a transformer 6.

The control signals to the gate drivers are provided from a digital core 7 which is isolated by a digital isolator 8. This provides control signals Va-iso, Vb-iso and Vc-iso to the gate drivers to switch the MOSFETS 2.

As mentioned above, such systems are bulky, heavy and expensive and also have associated parasitic issues and noise issues.

Figure 1B:
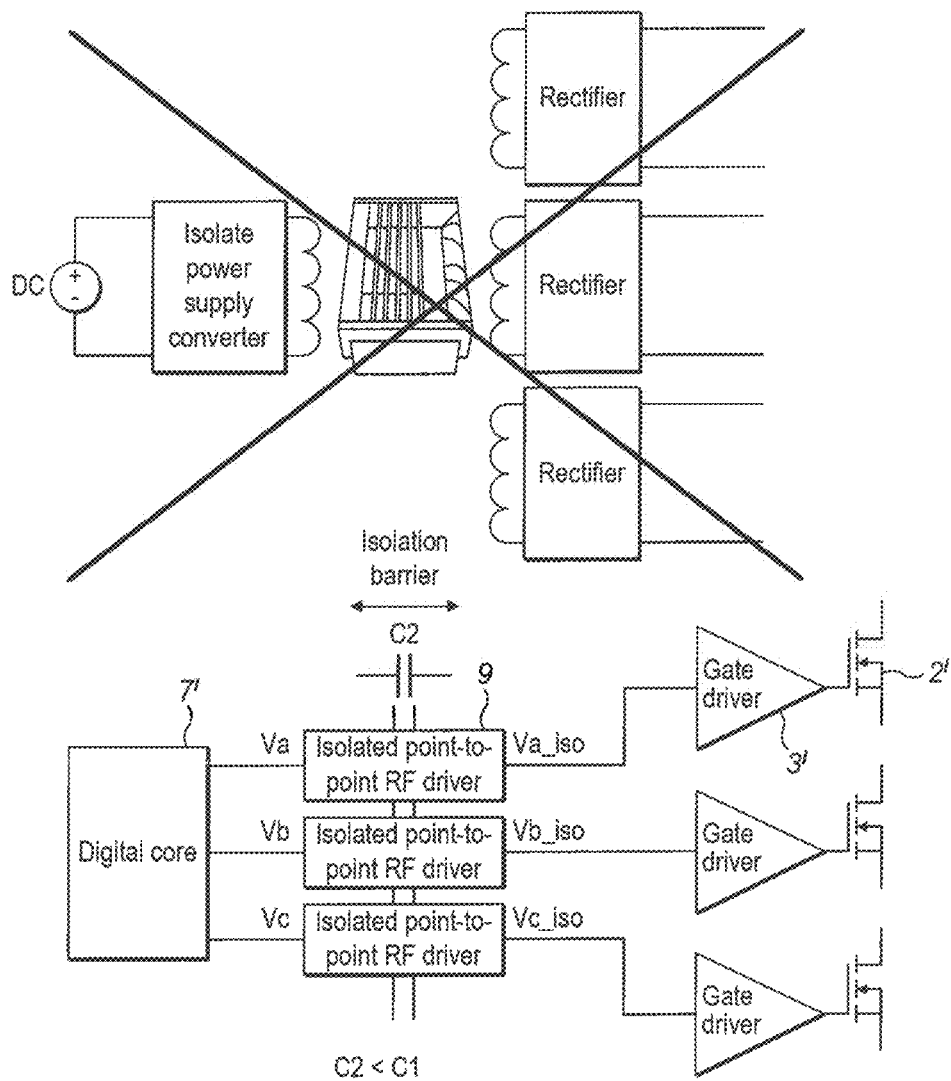
FIG. 1B shows how this disclosure modifies the conventional system.

According to the present disclosure, the separate isolated power arrangement is removed and replaced with an isolated point-to-point RF driver 9 as seen in FIG. 1B. According to the disclosure, the switching devices 2' are switched by gate drivers 3' controlled from the digital core 7' via isolated point-to-point RF drivers 9. This will be described in more detail with reference to FIG. 2 which shows a functional block diagram of an isolated point-to-point RF gate driver 9 driving a power switch 2'. The gate driver is an ultra-high frequency (UHF) driver using UHF band technology to transmit both signal and power for the gate driver through a low capacitance single resonator 10 by signal and power modulation. The power is transmitted through the resonator 10 in a continuous (CW) manner. The resonator 10 functions to transmit the power via a continuous wave signal and also to transmit a modulated switch control signal, from the gate control signal controller 11, from the primary side to the secondary side of the isolated gate driver 9. The power and the control signals are modulated using e.g. two different frequency bands with e.g. 1 GHz (CW) for the power and 2 GHz (ASK) for the control signal. Other modulation techniques (e.g. BFSK, BPSK) are also possible.

The isolator comprises single or multiple oscillators 12 to generate carrier frequencies. The control signal 11 is then modulated by a single channel modulator 13, with or without edge detection, onto a high frequency. The combined modulated control signal and power signal is amplified by a broadband GHz RF power amplifier 14. Amplification is required to provide sufficient power levels. The high frequency circuitry has matched impedances to maximise power transfer from the primary to the secondary side.

The primary side logic and control may be implemented in e.g. a microcontroller or a DSP.

On the secondary side, the frequency carrying the power is rectified at a rectifier 15, which can be e.g. a half-wave rectifier such as a series diode rectifier, or a full-wave rectifier e.g. a diode bridge, a voltage multiplier, or a shunt diode rectifier, and the rectified power is provided to a power supply block 16, which can be a positive or a negative power supply.

The information (i.e. on/off or high/low) embedded in the modulated power switch control signal, output from the resonator 10 at a different frequency, is filtered and demodulated at block 17 and the control signal is reconstructed (18). The output of the signal reconstruction block 18 is sent to a buffer circuit 19 which provides a low output impedance to drive the power switch 2'. The buffer circuit is powered by the power block 16. In one embodiment, the buffer uses Gallium Nitride (GaN) technology but could use other technologies e.g. silicon technology (although this has a longer propagation delay).

Figure 2:
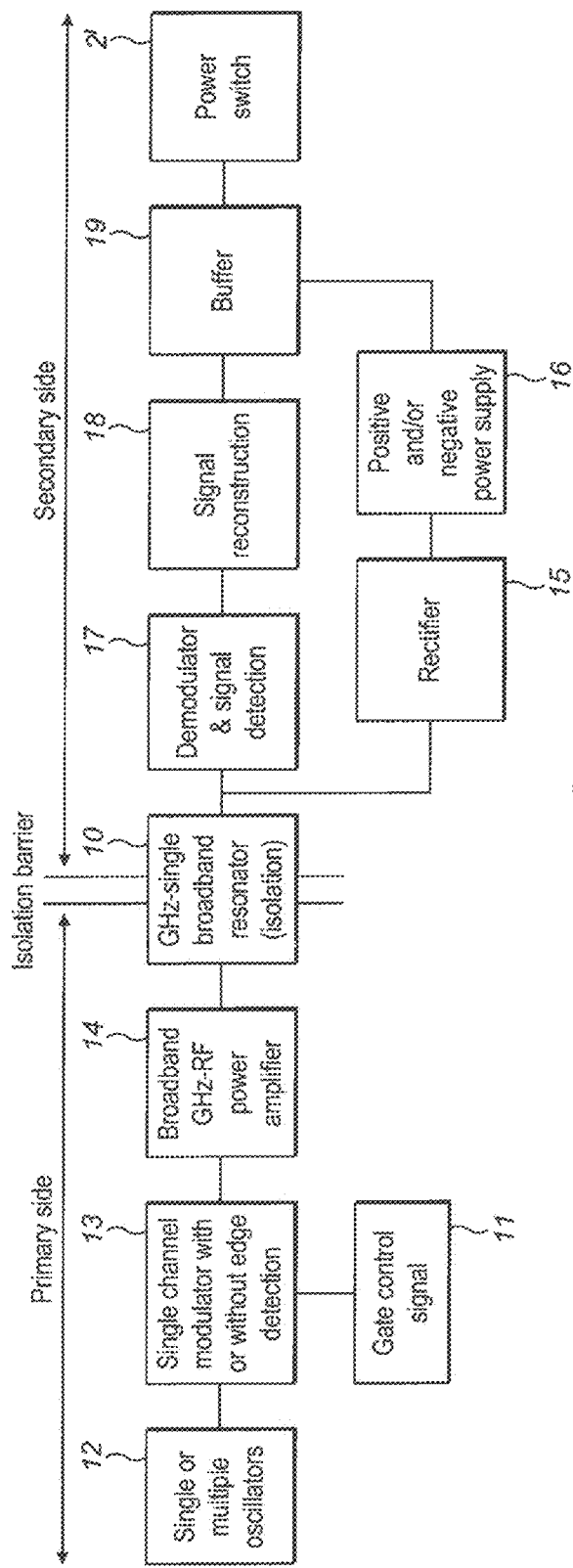
FIG. 2 is a block diagram of a gate driver according to this disclosure.

Whilst the isolator has been described in simple terms above in relation to the block diagram of FIG. 2, the various components can be implemented in many different ways. FIGS. 3 to 6 show various examples.

Figure 3:
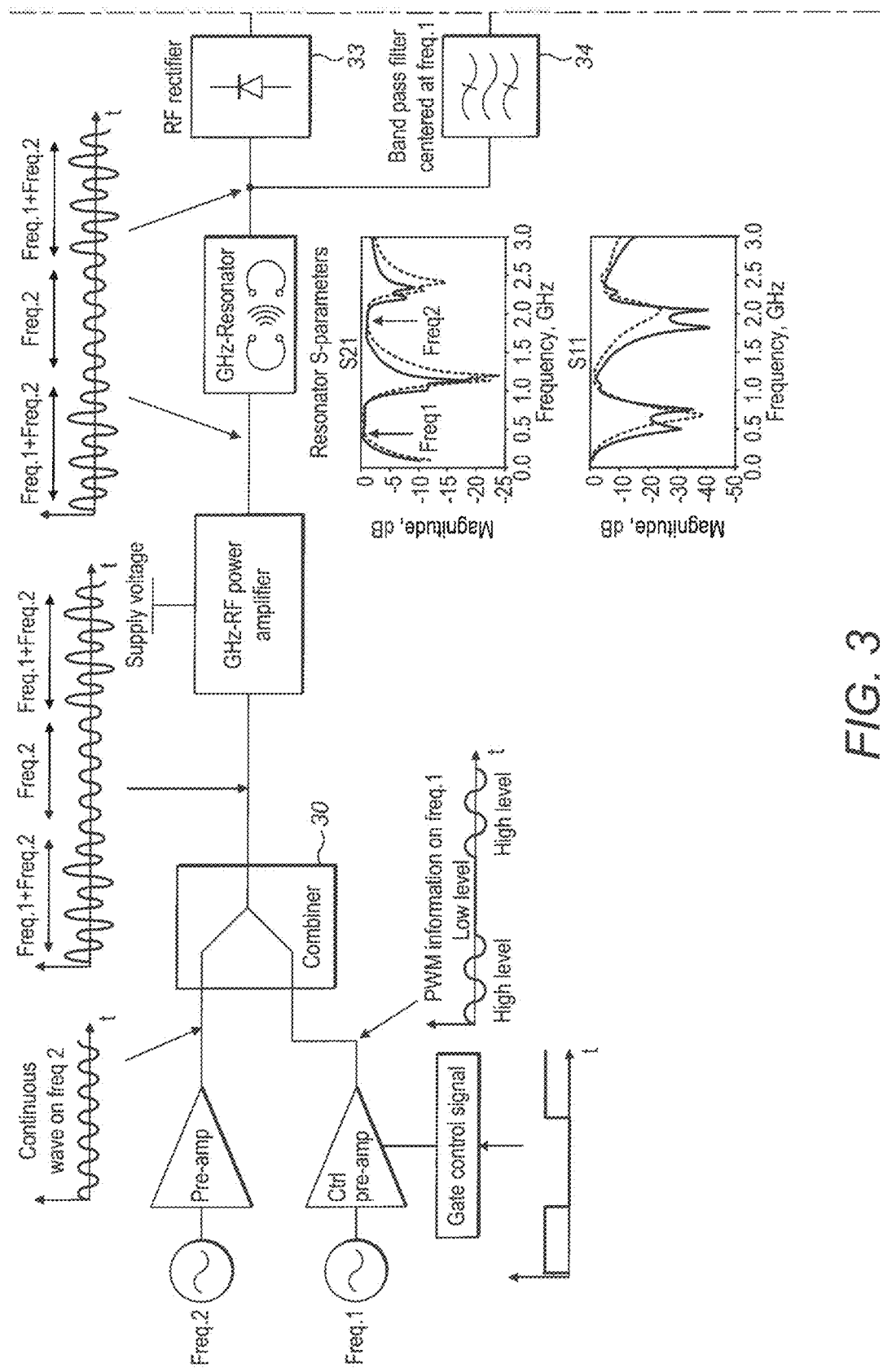
FIG. 3 shows one embodiment for implementing the gate driver of FIG. 2.
Figure 3:
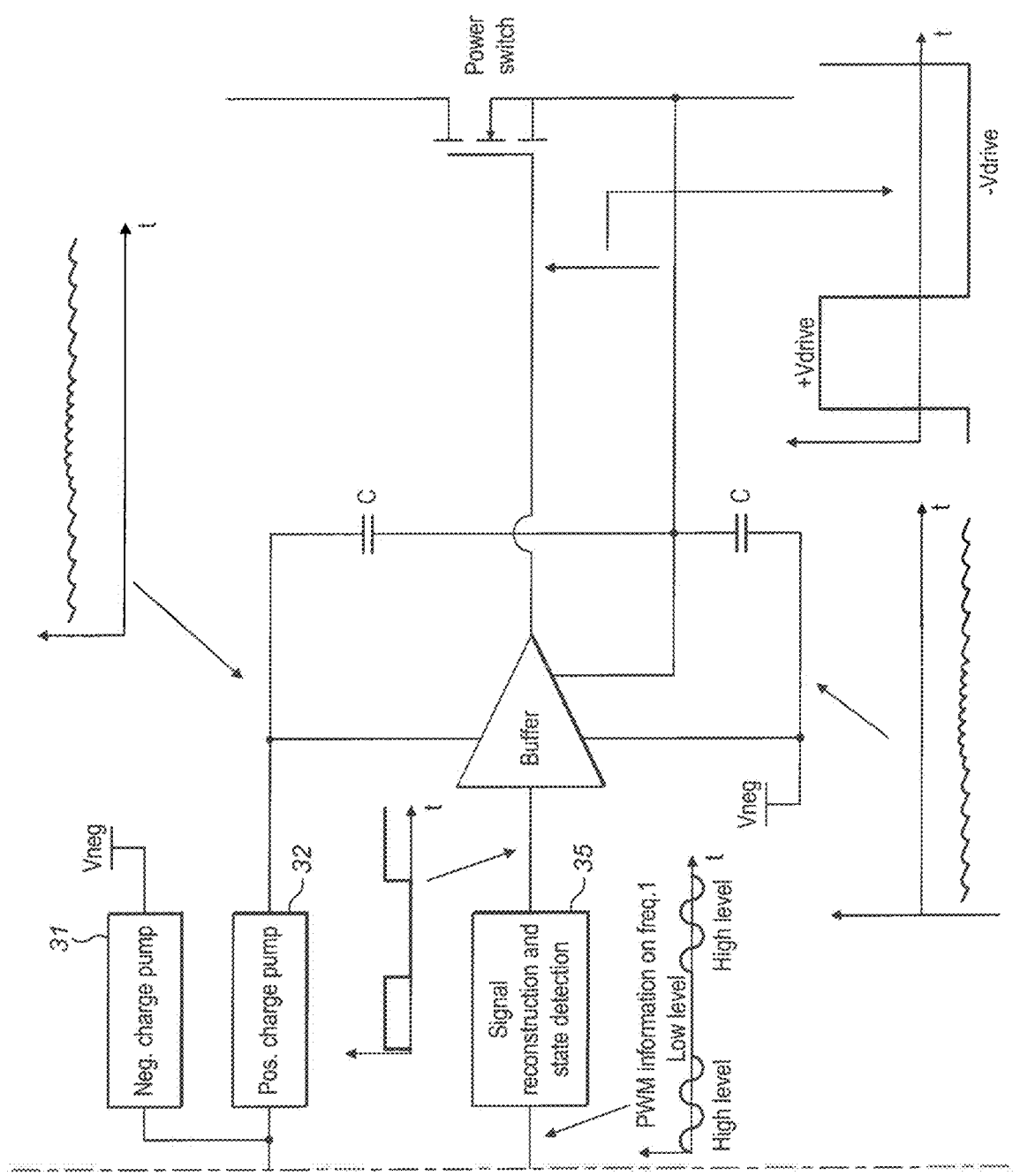

In the embodiment of FIG. 3, a combiner 30, more specifically an RF combiner, is used to combine the different frequency power signal and control signal. The combiner may be e.g. a resistive power combiner, a hybrid power combiner etc. Because the power signal is a continuous wave at one frequency and the control signal is a modulated signal at a different frequency the two signals can be sent on the same channel over two different frequency bands. If the frequencies are sufficiently far apart (e.g. in these examples by a factor of two, the resonator enables the losses to be minimised, which reduces the selectivity requirement of the demodulation filter. A combiner is a passive component and thus provides a simple solution. There are, however, fairly high losses (around −3 dB) associated with a combiner. Also in this implementation, the power supply is realised using a negative charge pump 31 and a positive charge pump 32. The power signal is rectified 33 and feeds the positive charge pump 32 to stabilize the power switch voltage (typically from 10V to 20V) and the negative charge pump 31 to generate a negative voltage rail (typically between −2V and −7V). A bandpass filter 34 filters out the power signal frequency and passes the modulated control signal frequency to a signal reconstruction and state detection block 35.

Figure 4:
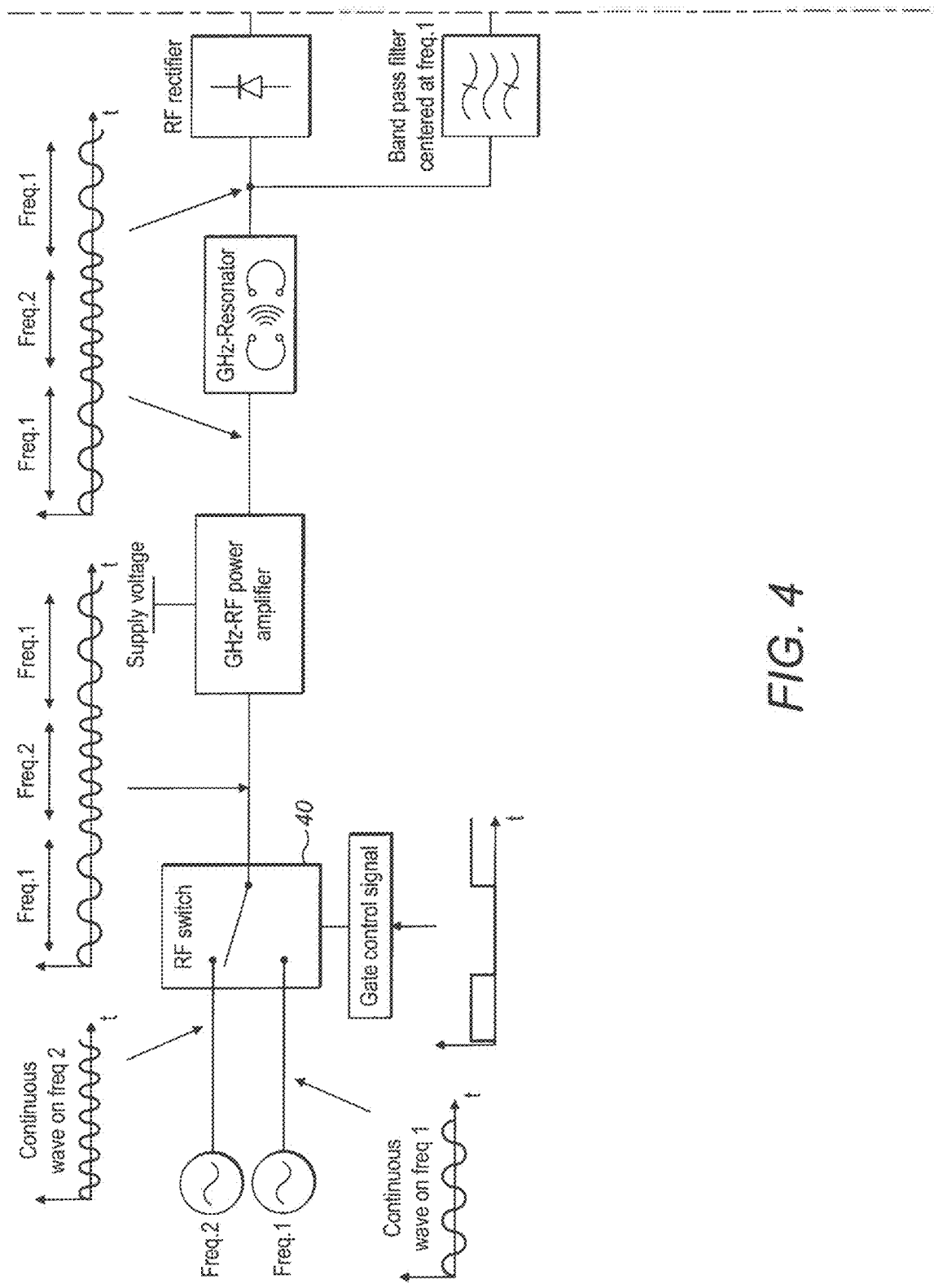
FIG. 4 shows an alternative embodiment for implementing the gate driver of FIG. 2.
Figure 4:
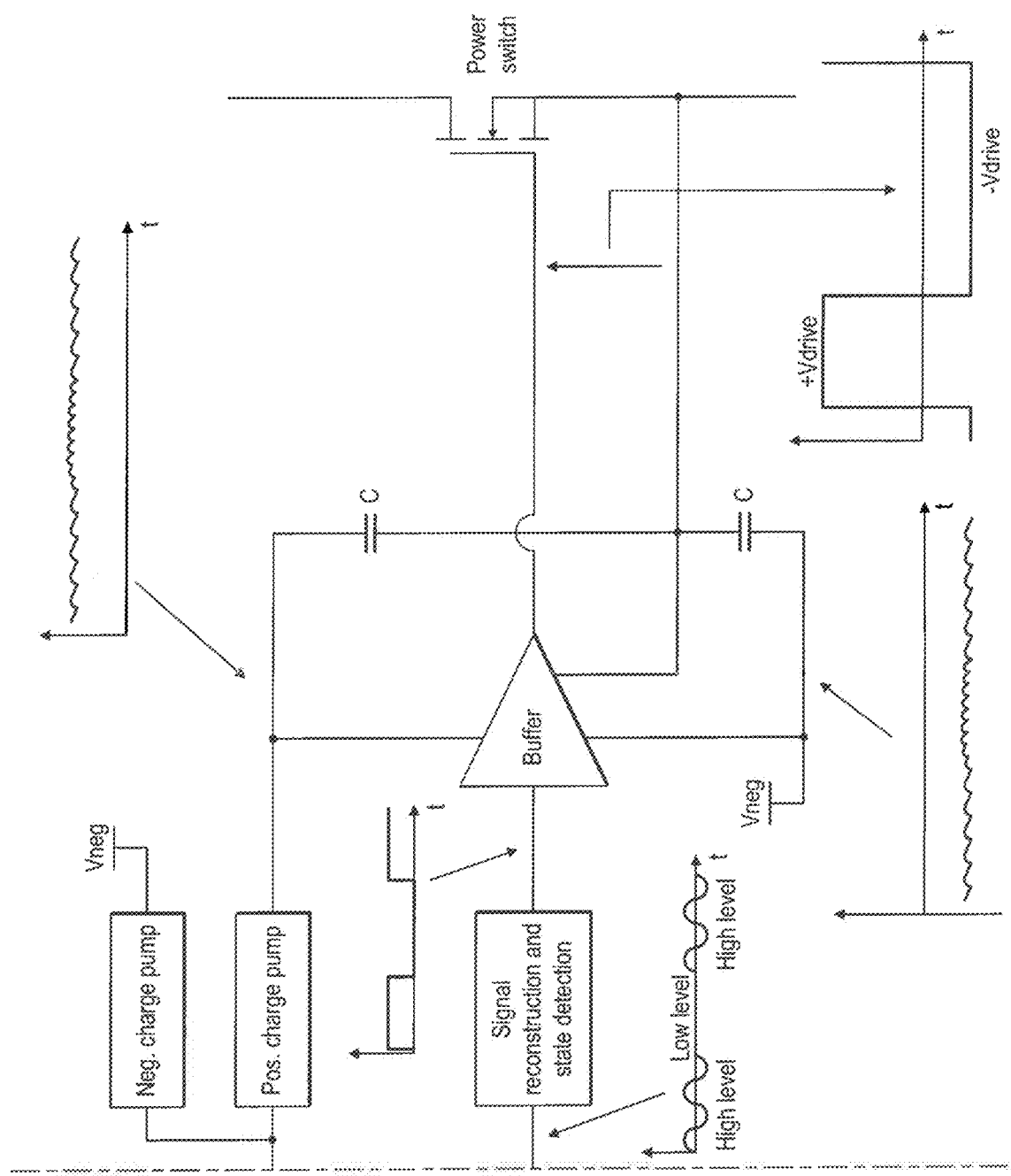

In the embodiment of FIG. 4, the isolator is similar to that shown in FIG. 3, but the power and control signals are combined using an RF switch 40. This solution has lower losses than the combiner of FIG. 3, but is a more complex and expensive solution. Also, isolation between the channels is improved with the RF switch 40.

Figure 5:
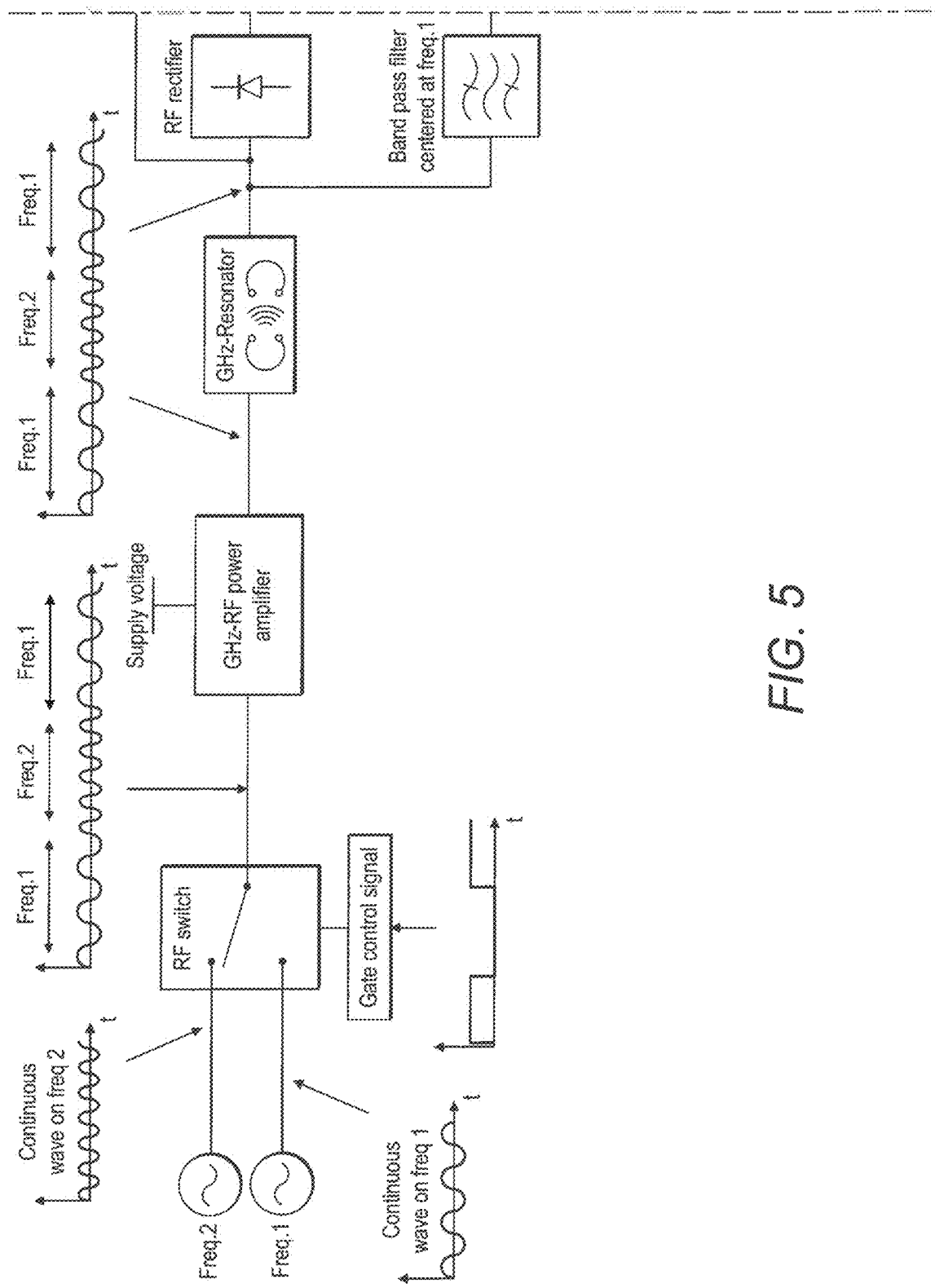
FIG. 5 shows an alternative embodiment for implementing the gate driver of FIG. 2.
Figure 5:
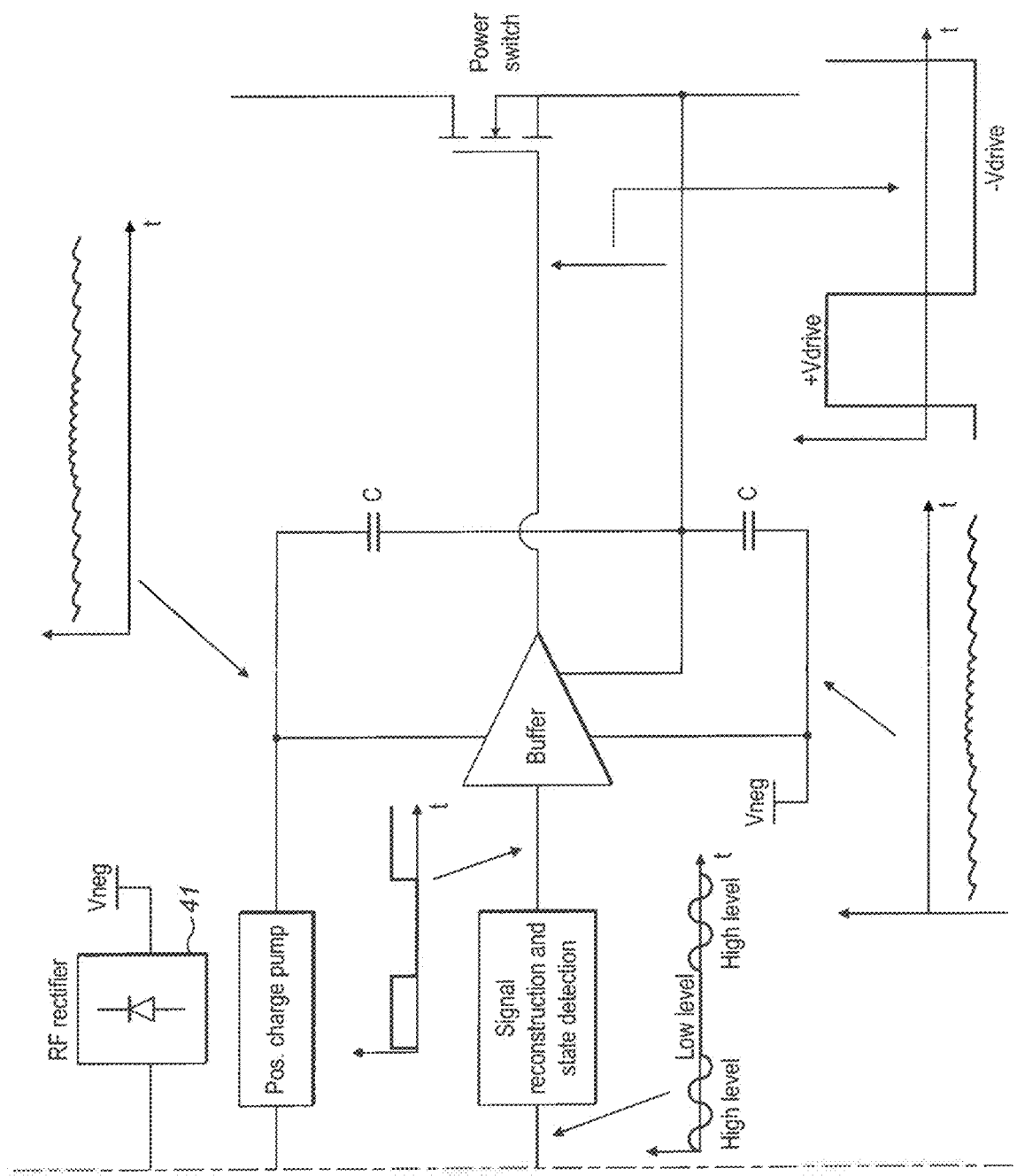

The embodiment of FIG. 5 is similar to that of FIGS. 3 and 4 but here the negative charge pump 31 is replaced by a simple rectifier 41. This provides a simpler solution but has a more limited voltage level.

Figure 6:
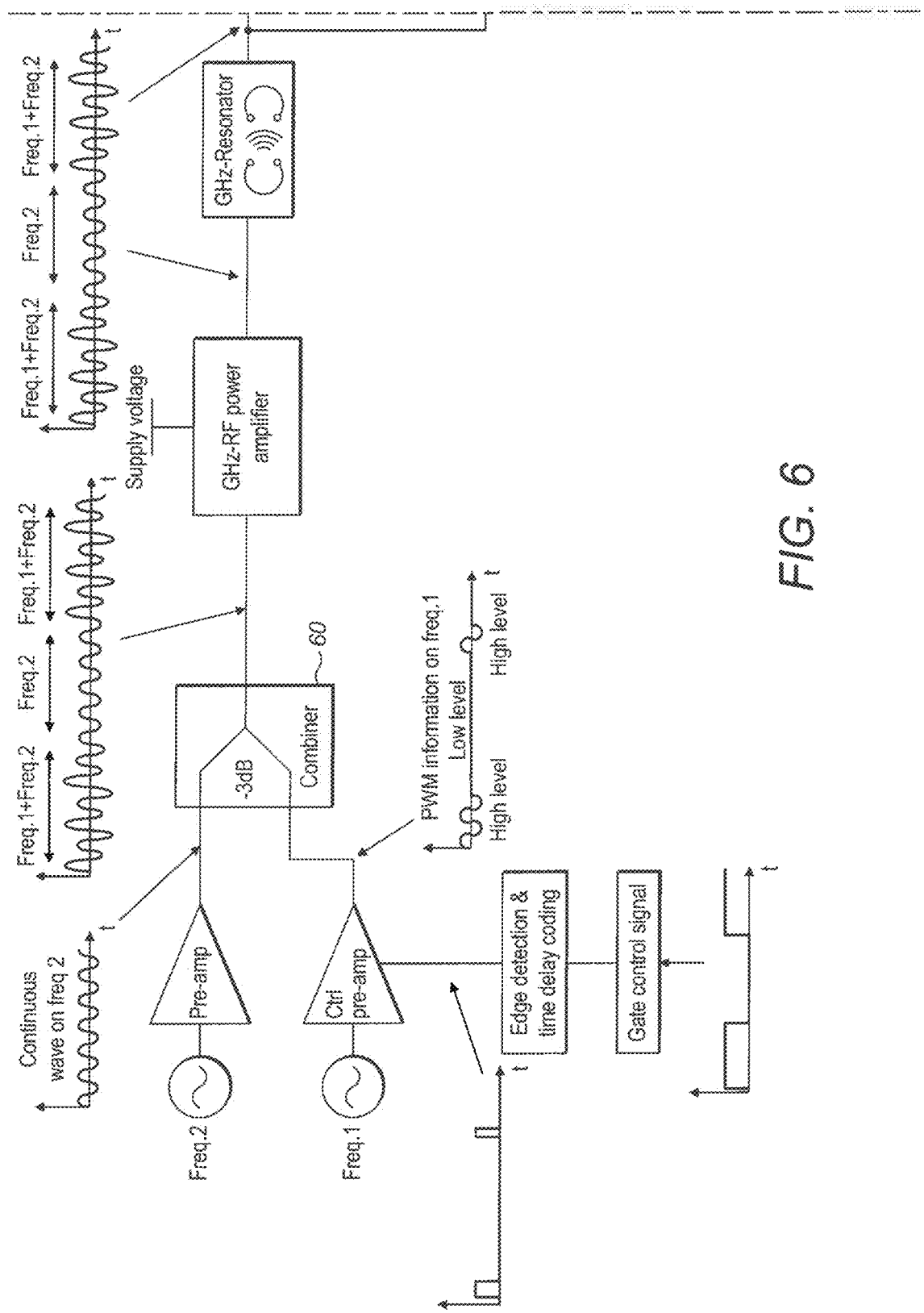
FIG. 6 shows an alternative embodiment for implementing the gate driver of FIG. 2.
Figure 6:
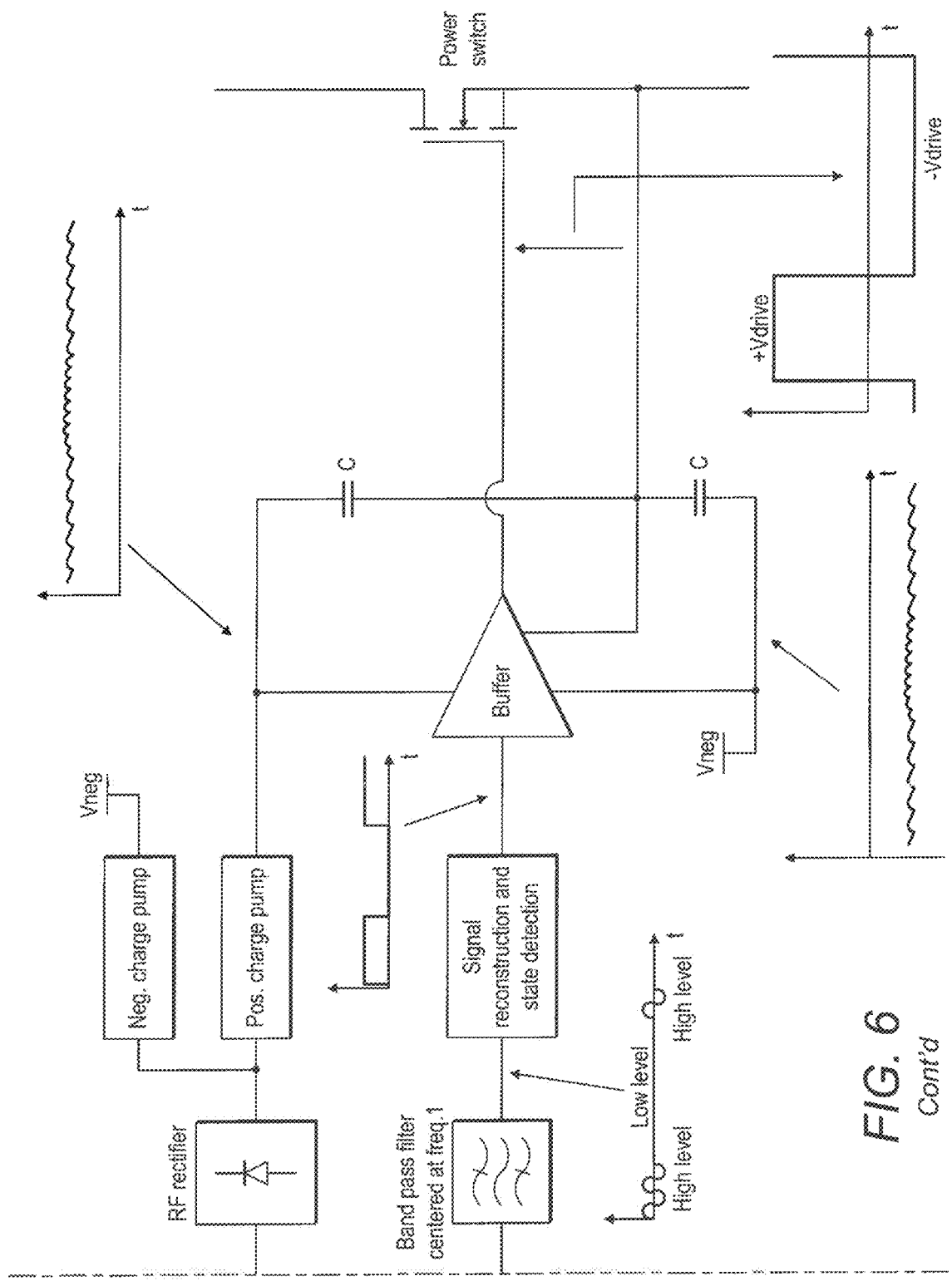
Figure 7:
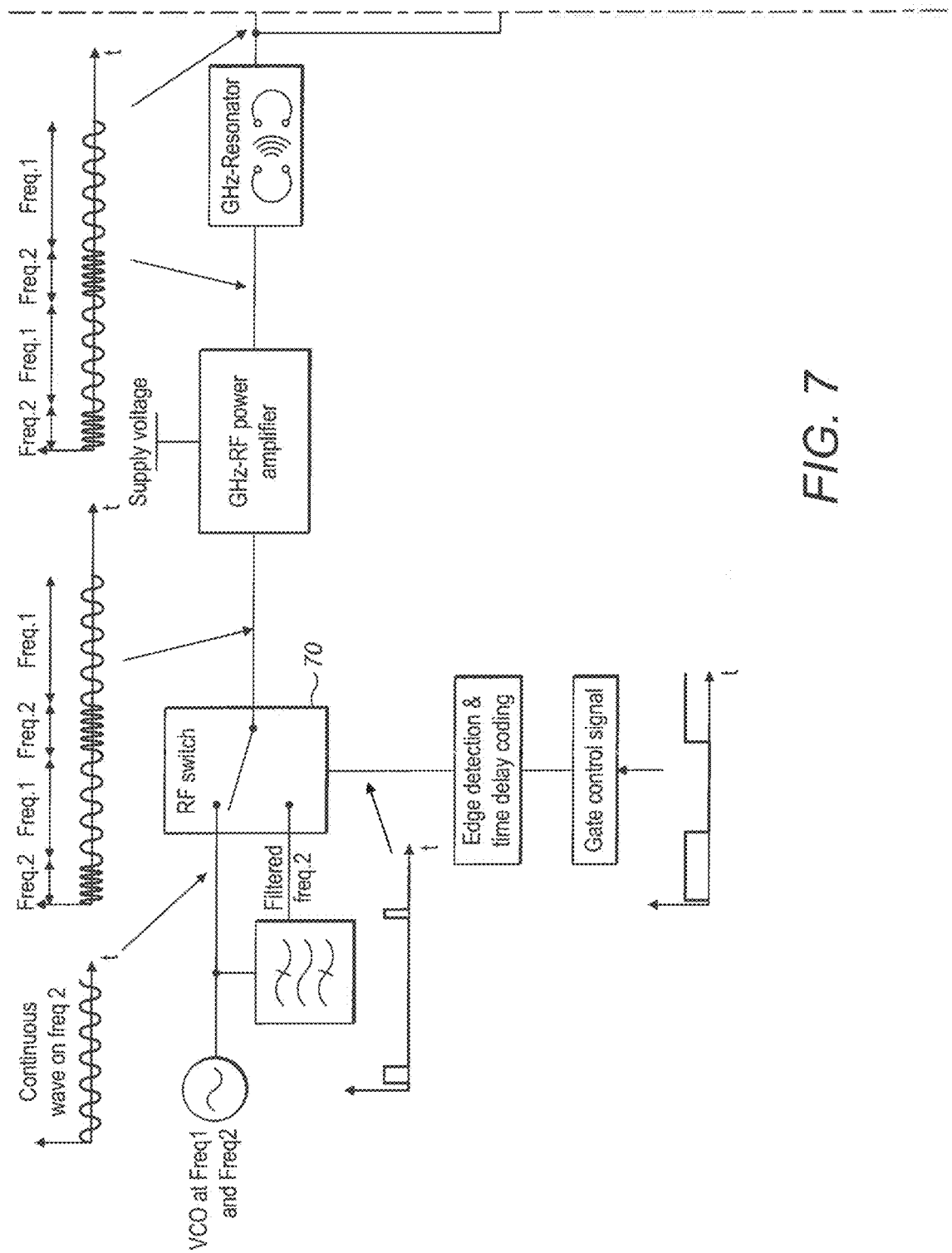
FIG. 7 shows an alternative embodiment for implementing the gate driver of FIG. 2.
Figure 7:
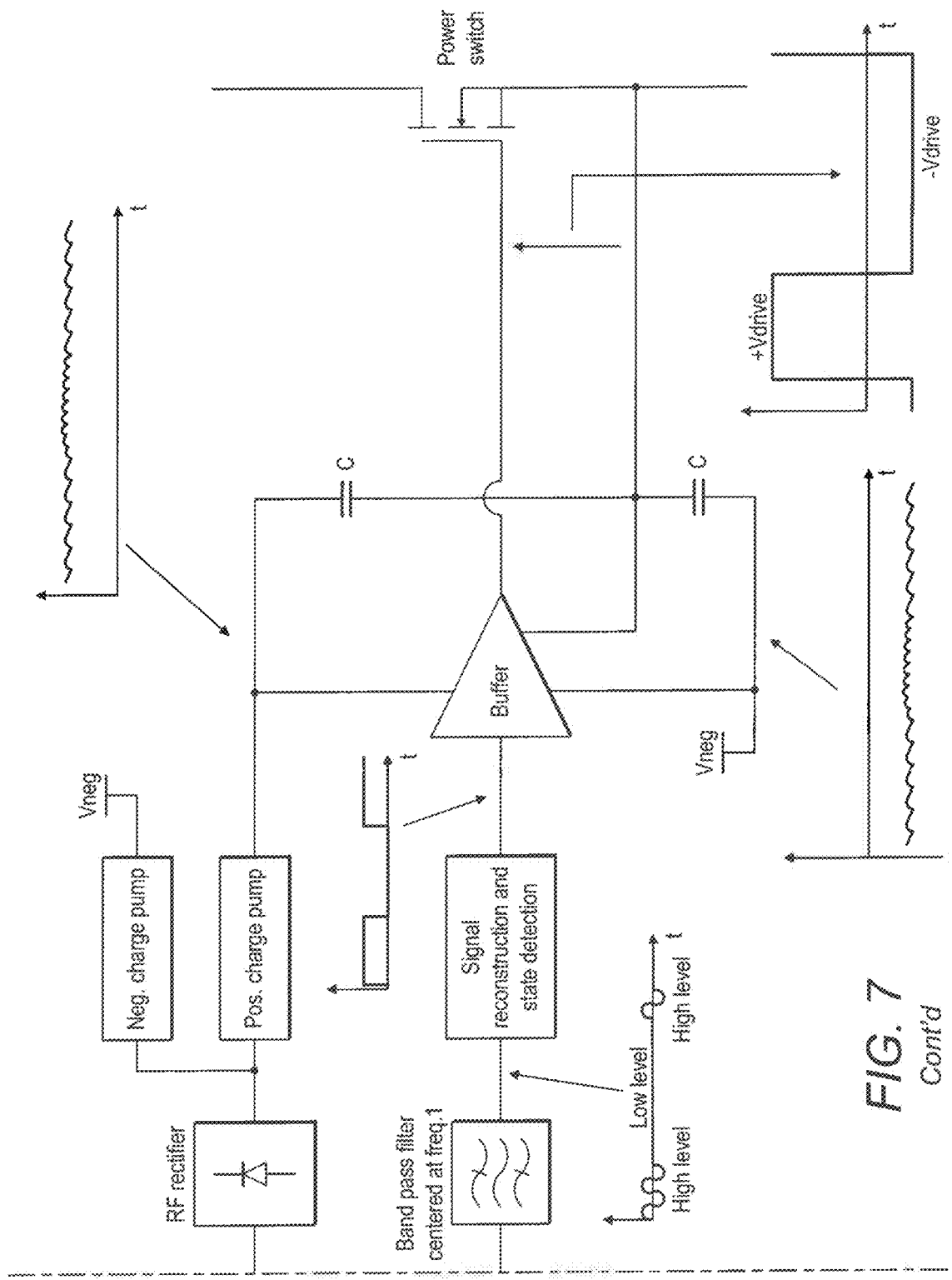

In the embodiment of FIG. 6, instead of transmitting voltage level as the signals, signal edge information is transmitted i.e. only the edge of the signal, rather than its level, is encoded onto the carrier frequency. This technique has a lower power dissipation, but is a more complex solution. FIG. 6 shows this embodiment using a combiner 60. FIG. 7 also uses edge detection but with an RF switch 70 and generates the modulation frequencies using a single VCO which generates harmonics of the fundamental frequency.

Figure 8:
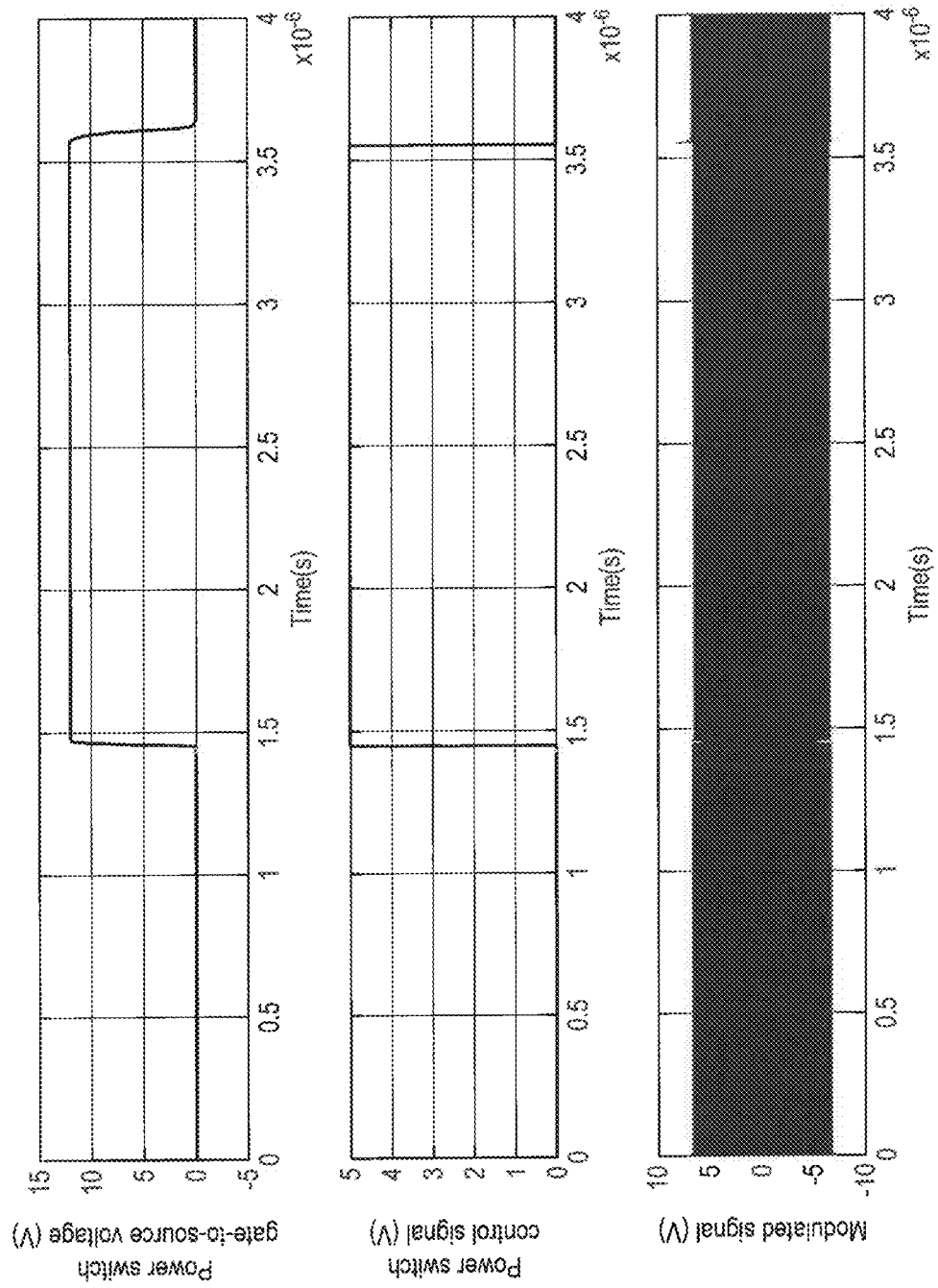
FIG. 8 shows simulation results for a system such as shown in FIG. 4
Figure 9:
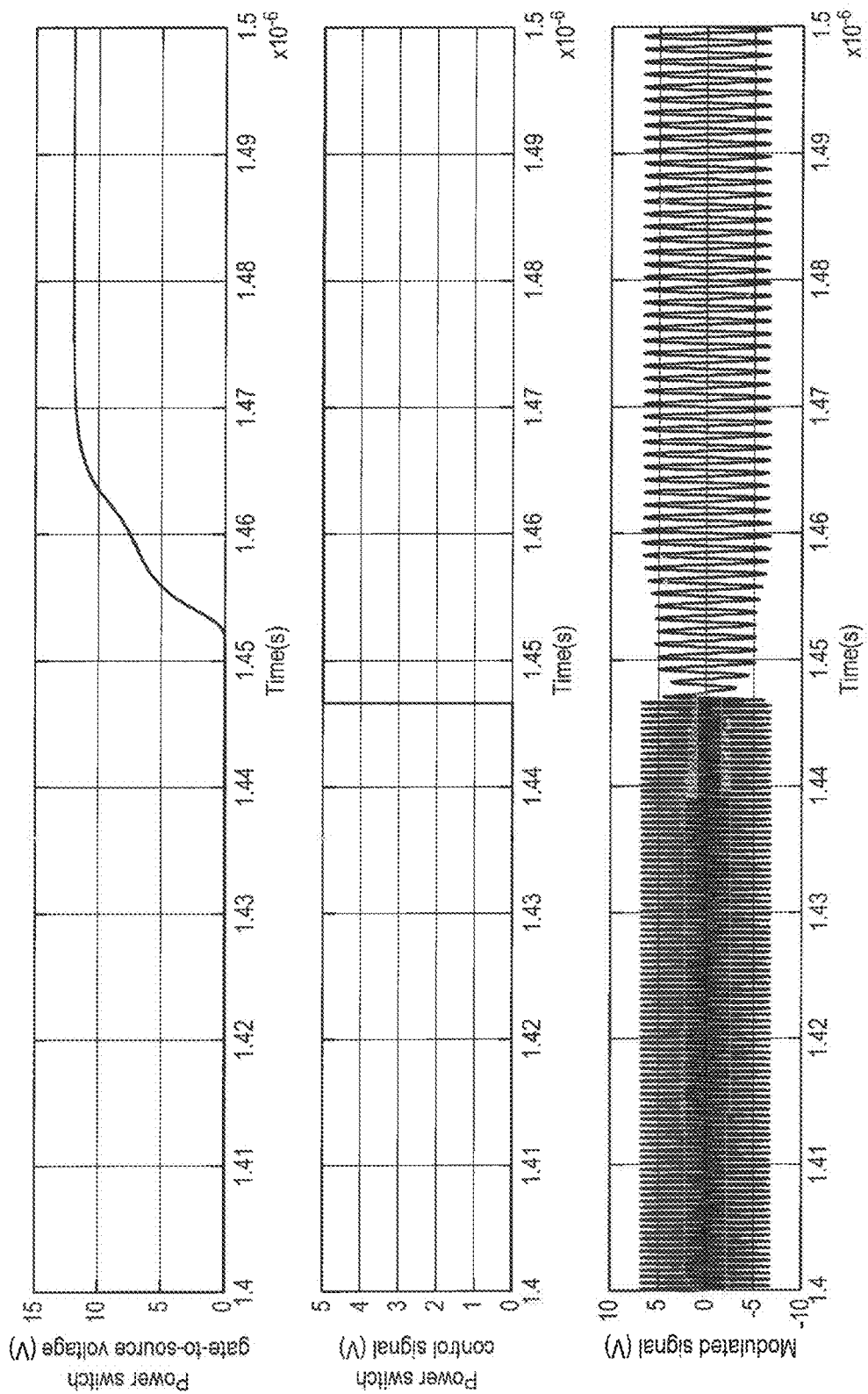
FIG. 9 shows a magnified detail of FIG. 8.

FIG. 8 shows Spice simulation results of the gate driver such as shown in FIG. 4 with a 5 nF capacitive load. FIG. 9 is a magnified view of a part of FIG. 8. It can be seen that the rise time is equal to 10 ns and the delay is equal to 20 ns, which meets the most demanding gate driver performances.

The system of the present disclosure exhibits low susceptibility to high dv/dt while having a compact, light constructions and high reliability due, partly, to fewer components, specifically using a single resonator to transmit both signal and power. An important benefit of the system is that it does not use an external isolated power supply, thus reducing the weight and size of the system.

The above description is of preferred embodiments only and variations are possible within the scope of the invention as defined by the claims.

The invention claimed is:

1. A power converter gate driver arrangement for providing a power output and a switching output for switching, in use, one or more switching devices, comprising:
   a digital control unit to provide a switching control signal;
   one or more isolated RF drive units connected to receive the switching control signal from the digital control unit and to output the power output and the switching output, each isolated RF drive unit comprising:
   oscillator means to generate one or more carrier frequencies;
   a single channel modulator to modulate the switching control signal onto one or more carrier frequencies;
   means for modulating a drive power signal onto a different one or more carrier frequencies;
   a single broadband resonator to transmit the modulated switching control signal and the modulated drive power signal;
   a rectifier configured to rectify the modulated drive power signal and to provide the rectified signal to a power supply unit to provide the power output; and
   means for demodulating and reconstructing the modified switching control signal to provide the switching output; and
   an amplifier for amplifying the combined modulated switching control signal and the modulated drive power signal.

2. The arrangement of claim 1, comprising a respective isolated RF drive unit for each switching device to be switched.

3. The arrangement of claim 1, wherein said single broadband resonator is configured to transmit the modulated drive power signal via a continuous wave signal.

4. The arrangement of claim 1, wherein said oscillator means comprises single or multiple oscillators to generate a corresponding one or multiple of carrier frequencies.

5. The arrangement of claim 1, wherein the rectifier comprises a half-wave rectifier or a full-wave rectifier.

* * * * *